US008837152B2

(12) United States Patent  (10) Patent No.: US 8,837,152 B2
Chen  (45) Date of Patent: Sep. 16, 2014

(54) ELECTRONIC MODULE INCLUDING HANDLE AND HEAT DISSIPATING MEMBER

(75) Inventor: Wei-Shih Chen, Taipei (TW)

(73) Assignee: Inventec Corporation, Taipei (TW)

( * ) Notice: Subject to any disclaimer, the term of this patent is extended or adjusted under 35 U.S.C. 154(b) by 292 days.

(21) Appl. No.: 13/435,213

(22) Filed: Mar. 30, 2012

(65) Prior Publication Data

US 2013/0155618 A1 Jun. 20, 2013

(30) Foreign Application Priority Data

Dec. 15, 2011 (TW) .............................. 100146517 A

(51) Int. Cl.
*H05K 7/20* (2006.01)
*F28F 7/00* (2006.01)

(52) U.S. Cl.
CPC .......... *H05K 7/20418* (2013.01); *H05K 7/2049* (2013.01)
USPC ...... 361/710; 361/711; 361/715; 361/679.54; 165/80.3; 174/548

(58) Field of Classification Search
USPC .......... 361/679.54, 704–723; 165/80.1–80.3, 165/185; 257/712, 718–719, 721–722; 174/547–548; 312/332.1, 333
See application file for complete search history.

(56) References Cited

U.S. PATENT DOCUMENTS

| 5,161,087 A | * | 11/1992 | Frankeny et al. | ............. | 361/702 |
| 6,278,610 B1 | * | 8/2001 | Yasufuku et al. | ............. | 361/704 |
| 6,942,506 B2 | * | 9/2005 | Kimura et al. | ................ | 439/159 |
| 7,139,174 B1 | * | 11/2006 | Nguyen et al. | ................ | 361/719 |
| 2013/0070422 A1 | * | 3/2013 | Dunham et al. | ............. | 361/725 |

FOREIGN PATENT DOCUMENTS

TW  200926942  6/2009

* cited by examiner

*Primary Examiner* — Zachary M Pape
(74) *Attorney, Agent, or Firm* — CKC & Partners Co., Ltd.

(57) ABSTRACT

An electronic module including a supporting frame, a handle, an electronic device, and a heat dissipating member is provided. The handle assembled to the supporting frame is open or closed relative to the supporting frame. The electronic device is detachably assembled on the supporting frame. The heat dissipating member detachably assembled to the handle moves relative to the supporting frame with the handle. When the handle is closed relative to the supporting frame, the electronic device is fixed on the supporting frame by the handle, and the heat dissipating member leans against the electronic device. When the handle is opened relative to the supporting frame, the heat dissipating member is far away from the electronic device.

7 Claims, 3 Drawing Sheets

ELECTRONIC MODULE INCLUDING HANDLE AND HEAT DISSIPATING MEMBER

CROSS-REFERENCE TO RELATED APPLICATION

This application claims the priority benefit of Taiwan application serial no. 100146517, filed on Dec. 15, 2011. The entirety of the above-mentioned patent application is hereby incorporated by reference herein and made a part of this specification.

BACKGROUND OF THE INVENTION

1. Field of the Invention

The present invention generally relates to an electronic module, in particular, to an electronic module having a heat dissipating member.

2. Description of Related Art

An existing server is generally mounted with multiple hard disk modules to store enormous amount of data. Besides, The hard disk module is usually mounted in a cabinet of the server by a fixing manner without using any screw for inspection and maintenance.

Further, taking a rack server for example, a fan is usually disposed at a rear panel of the cabinet, to dissipate the heat from the cabinet. This configuration forms a mechanism that the inner space of the cabinet and all the electronic devices in the cabinet are regarded as one unit for heat dissipation. If only a part of the electronic devices in the cabinet operate or the heat generation efficiency of a part of the electronic devices is higher than that of the other electronic devices, the above configuration cannot effectively dissipate the heat accumulated in some part of the space.

SUMMARY OF THE INVENTION

The present invention provides an electronic module, which has an easily mounted heat dissipating member, to effectively dissipate the heat generated by electronic devices mounted thereon.

An embodiment of the present invention provides an electronic module, including a supporting frame, a handle, an electronic device and a heat dissipating member. The handle assembled to the supporting frame is open or closed relative to the supporting frame. The electronic device is detachably assembled on the supporting frame. The heat dissipating member detachably assembled to the handle moves relative to the supporting frame with the handle. When the handle is closed relative to the supporting frame, the electronic device is fixed on the supporting frame by the handle, and the heat dissipating member leans against the electronic device. When the handle is opened relative to the supporting frame, the heat dissipating member is far away from the electronic device.

In an embodiment of the present invention, the handle has a holding portion and a pivoting portion opposite to each other. The pivoting portion is pivoted to the supporting frame, the heat dissipating member is located between the holding portion and the pivoting portion, and the heat dissipating member rotates relative to the supporting frame with the handle about the pivoting portion.

In an embodiment of the present invention, the handle is U-shaped and has two opposite ends respectively pivoted to the supporting frame to form the pivoting portion. The handle also has a pair of support arms connected between the pivoting portion and the holding portion, and the heat dissipating member is connected between the pair of the support arms.

In an embodiment of the present invention, when the handle is closed relative to the supporting frame, an orthogonal projection of the U-shaped handle on the electronic device overlaps the periphery of the electronic device.

In an embodiment of the present invention, the heat dissipating member includes a base, multiple fins, and a pair of clamping members. The fins stand on the base. The clamping members are disposed at two opposite sides of the base, the fins are located between the clamping members, and the clamping members are respectively clamped on the support arms.

In an embodiment of the present invention, the handle has a pair of buckling protrusions located on the support arms, and each clamping member has a buckling recessed portion. The buckling protrusions are respectively buckled to the corresponding buckling recessed portions, so that the heat dissipating member is fixed between the pair of the support anus of the handle.

In an embodiment of the present invention, each support arm has a side edge, and the clamping members respectively clamp the side edges and slide along the side edges from the pivoting portion towards the holding portion, so that the buckling protrusions are respectively buckled to the corresponding buckling recessed portions.

In an embodiment of the present invention, each clamping member includes an elastic member and a plate. The elastic member is disposed on the base and located at one side of the fins. The plate is disposed above the elastic member, parallel with the base and spaced from the elastic member by a distance.

In an embodiment of the present invention, the distance is smaller than the thickness of the side edge, so that the side edge is clamped between the elastic member and the plate.

In an embodiment of the present invention, the plate and a fin adjacent to the elastic member are integrally formed.

In view of the above, in the electronic module provided by the embodiment of the present invention, the heat dissipating member is disposed on the handle, so that when the electronic device is assembled on the supporting frame, and the handle is closed relative to the supporting frame to fix the electronic device, the heat dissipating member leans against the electronic device, to dissipate the heat from the electronic device. Therefore, the heat dissipating member is disposed in the existing space through a simple mechanism, and apparatuses applying this electronic module all achieve better heat dissipation efficiency.

In order to make the aforementioned features and advantages of the present invention more comprehensible, embodiments are described in detail below with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
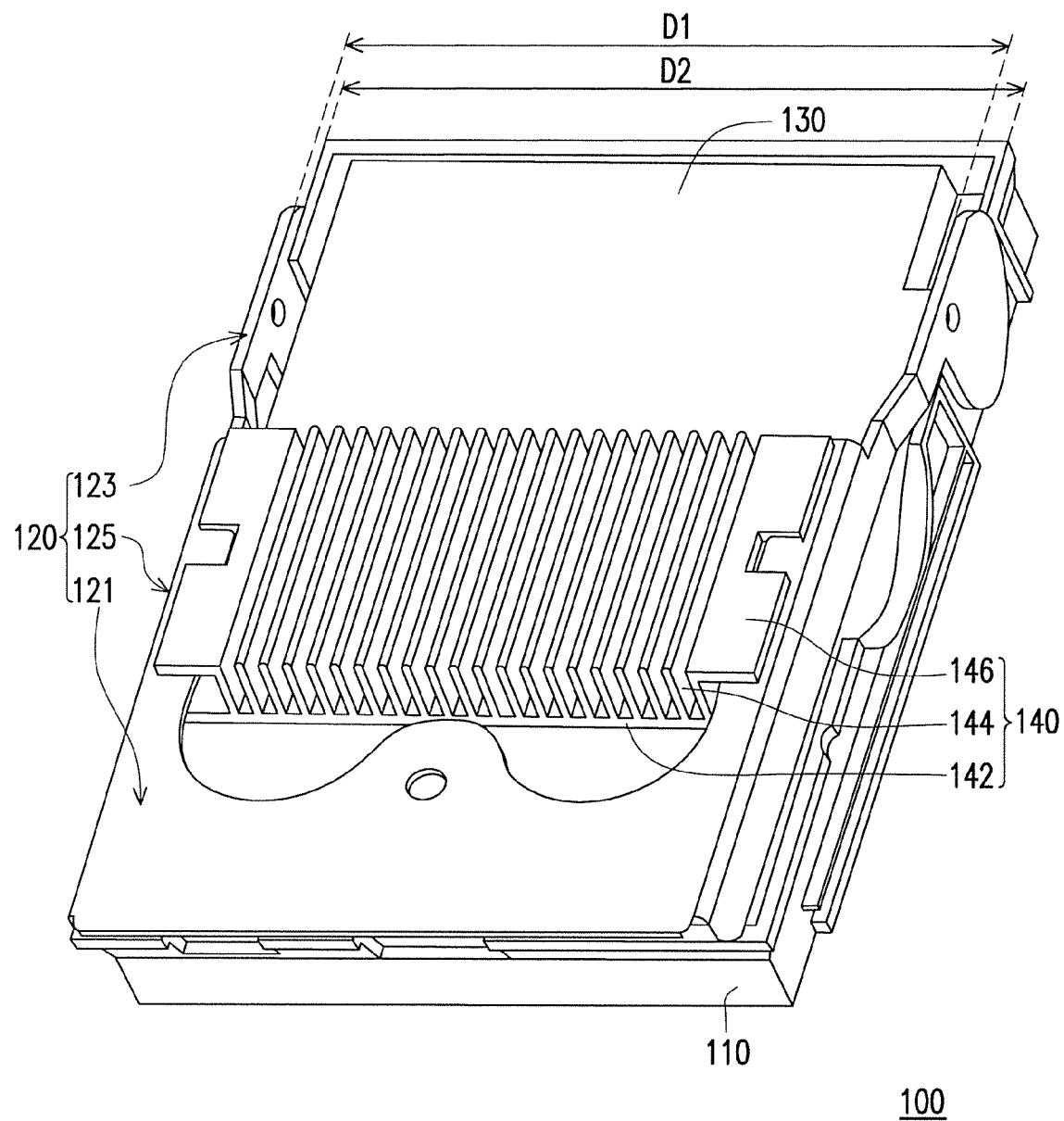
FIG. 1 is a schematic view of an electronic module according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic view of an electronic module according to an embodiment of the present invention. The electronic module 100 includes a supporting frame 110, a handle 120 and an electronic device 130. In this embodiment, the electronic module 100 is, for example, a hard disk module disposed in a cabinet of a server (not shown), the supporting frame 110 is disposed on a platform (not shown) in the cabinet of the server, and the handle 120 assembled to the supporting frame 110 is open or closed relative to the supporting frame 110. The electronic device 130 is a hard disk detachably assembled on the supporting frame 110, and serves as one of multiple data access units in the server. The type of the electronic device 130 is not limited herein, and any detachable electronic apparatus disposed in a server or a computer apparatus is applicable to the present invention.

In this embodiment, the handle 120 has a holding portion 121 and a pivoting portion 123 opposite to each other. The pivoting portion 123 is pivoted to the supporting frame 110, so that a user may apply a force on the holding portion 121 and enable the handle 120 to rotate relative to the supporting frame 110 to reach the aforementioned opened or closed state. Further, in this embodiment, a relative distance D1 from the handle 120 to the pivoting portion 123 is smaller than a relative distance D2 from the supporting frame 110 to a corresponding place, so that when the handle 120 is closed relative to the supporting frame 110, the handle 120 is interfered with the supporting frame 110 due to a difference between the relative distances D1 and D2, and thus the handle 120 is retained to the supporting frame 110. This embodiment does not limit the retaining structure between the handle 120 and the supporting frame 110, and any mechanism that enables the handle 120 to be retained to and released from the supporting frame 110 is applicable to the present invention.

In this embodiment, the heat generated by the electronic device 130 is dissipated by a heat dissipation mechanism of the system (for example, a fan disposed at the back of the rack or cabinet, which is described in the prior art and will not be repeated herein), and a simple structure may also be adopted to individually dissipate the heat from the electronic device 130. That is, the electronic module 100 of this embodiment further includes a heat dissipating member 140, detachably assembled on the handle 120 and located between the pivoting portion 123 and the holding portion 121, and moving relative to the supporting frame 110 with the handle 120. In other words, the heat dissipating member 140 of this embodiment is substantially located between the holding portion 121 and the pivoting portion 123, and rotates relative to the supporting frame 110 with the handle 120 about the pivoting portion 123.

When the handle 120 is closed relative to the supporting frame 110, the electronic device 130 is fixed on the supporting frame 110 by the handle 120, and the heat dissipating member 140 on the handle 120 leans against the electronic device 130, so that the heat generated by the electronic device 130 may be dissipated by the heat dissipating member 140. On the contrary, when the handle 120 is opened relative to the supporting frame 110, the handle 120 moves the heat dissipating member 140 away from the electronic device 130, which facilitates the disassembly and assembly of the electronic device 130 by the user. Therefore, the heat dissipating member 140 disposed on the handle 120 may further dissipate the heat generated by the electronic device 130.

Figure 2:
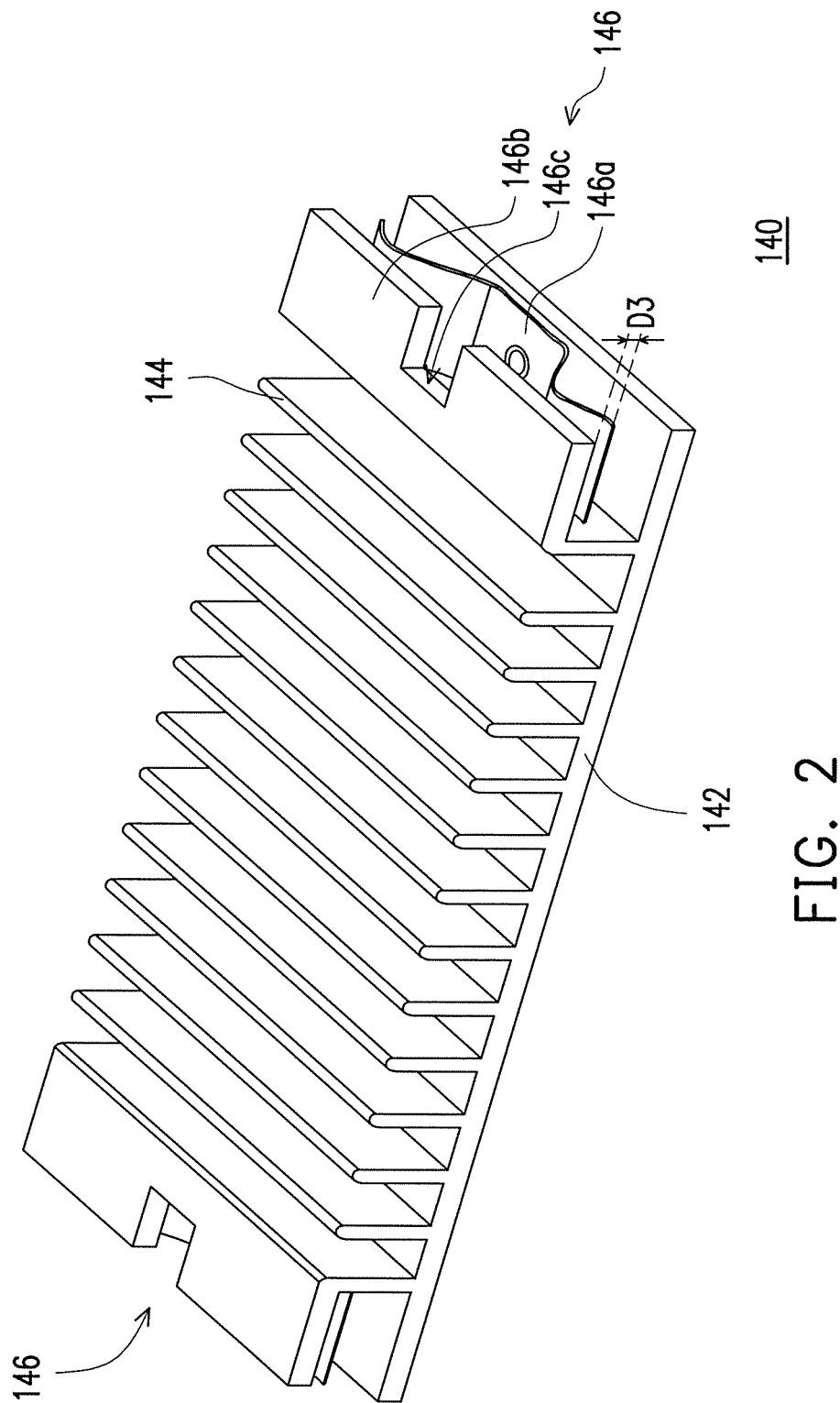
FIG. 2 is a schematic view of a heat dissipating member in FIG. 1.
Figure 3:
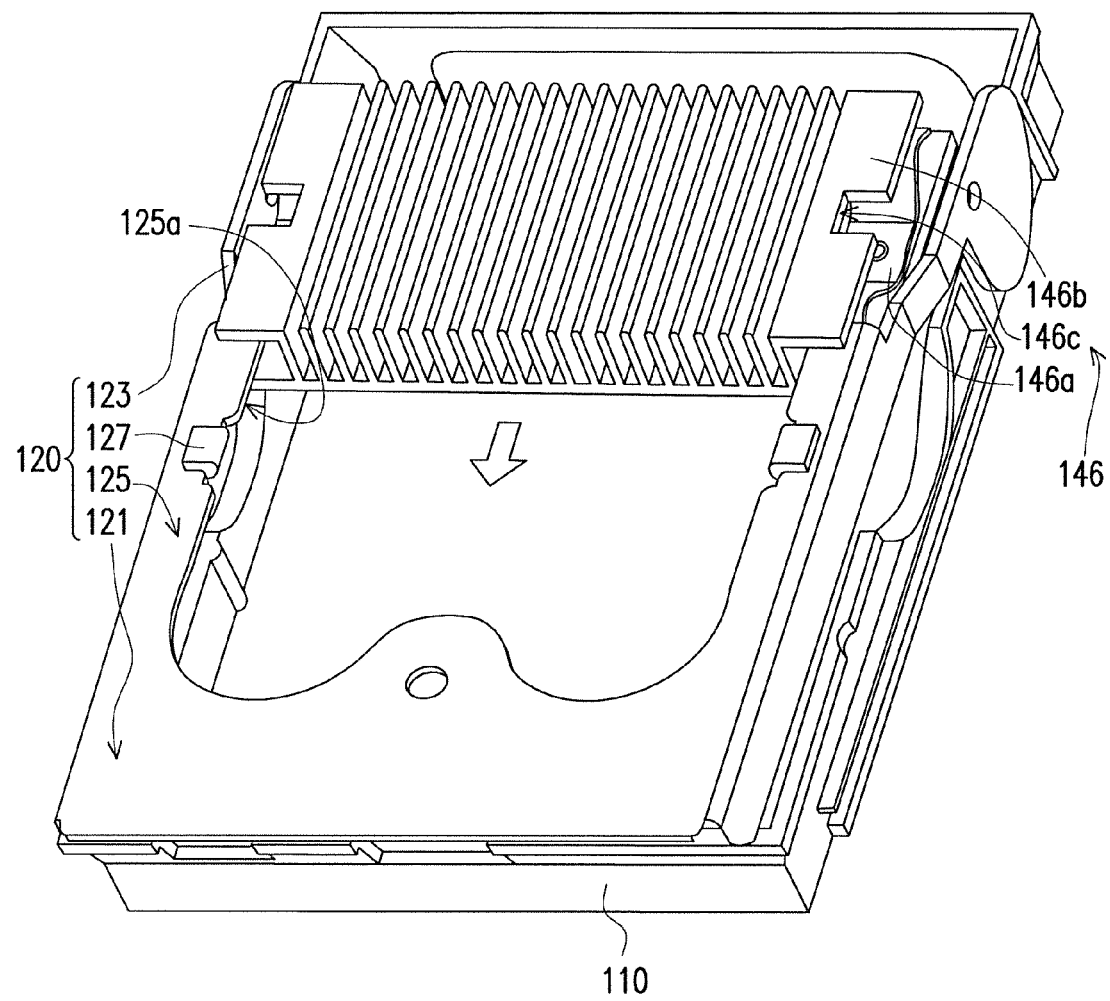
FIG. 3 is a schematic view of the heat dissipating member in FIG. 2 before being assembled to a handle.

FIG. 2 is a schematic view of the heat dissipating member in FIG. 1. FIG. 3 is a schematic view of the heat dissipating member in FIG. 2 before being assembled to the handle. Referring to FIG. 1 to FIG. 3, in this embodiment, the handle 120 and the supporting frame 110 are in the form of an electric brake, that is, the handle 120 is U-shaped and has two opposite ends respectively pivoted to the supporting frame 110 to form a pair of the pivoting portions 123. The handle 120 further has a pair of support arms 125 connected between the pivoting portion 123 and the holding portion 121, and the heat dissipating member 140 is connected between the pair of the support arms 125.

Specifically, the heat dissipating member 140 includes a base 142, multiple fins 144 standing on the base 142, and a pair of clamping members 146 disposed at two opposite sides of the base 142. The fins 144 are located between the pair of the clamping members 146, and the clamping members 146 are clamped on the support arms 125 of the handle 120, so that the base 142 and the fins 144 thereon are connected to the handle 120. It should be noted that, when the handle 120 is closed relative to the supporting frame 110, an orthogonal projection of the U-shaped handle 120 on the electronic device 130 overlaps the periphery of the electronic device 130.

In other words, since the handle 120 is disposed substantially surrounding the periphery of the electronic device 130 (when the handle 120 is in the closed state relative to the supporting frame 110), the heat dissipating member 140 located between the support arms 125 enables the base 142 to lean against the electronic device 120, so that the fins 144 dissipate the heat generated by the electronic device 130 to the maximum extent. Further, in this embodiment, the heat dissipation mode of the heat dissipating member 140 is not limited, and in another embodiment not shown, the fins 144 may be replaced by a heat pipe, a fan or other apparatuses that can dissipate the heat from the electronic device 130.

Further referring to FIG. 2 and FIG. 3, in this embodiment, each support aim 125 has a side edge 125a, and the clamping members 146 of the heat dissipating member 140 are respectively clamped on the pair of the side edges 125a. Each clamping member 146 includes an elastic member 146a and a plate 146b. The elastic member 146a is, for example, a V-shaped blade spring extending away from the base 142, and disposed on the base 142 and located at one side of the fins 144. The plate 146b is disposed above the elastic member 146a, parallel with the base 142 and spaced from the elastic member 146a by a distance D3. In this embodiment, the distance D3 is smaller than the thickness of the side edge 125a, so that the side edges 125a are clamped between the elastic member 146a and the plate 146b.

When the user intends to assemble the heat dissipating member 140 to the handle 120, since the side edges 125a are clamped between the elastic member 146a and the plate 146b, the heat dissipating member 140 is embedded and slides between the support arms 125 of the handle 120 along the side edges 125a from one side adjacent to the pivoting portion 123 of the handle 120, that is, the handle 120 and the clamping members 146 of the heat dissipating member 140 together form a rail structure, so that the heat dissipating member 140 is enabled to move from the pivoting portion 123 of the handle 120 towards the holding portion 121.

The handle 120 further has a pair of buckling protrusions 127 located on the support arms 125, and the buckling protrusions 127 are, for example, formed by bending the side edges 125a upward. Correspondingly, each clamping member 146 has a buckling recessed portion 146c located on the plate 146b. When the heat dissipating member 140 slides along the side edges 125a of the support arms 125, the buckling protrusions 127 are respectively buckled to the corresponding buckling recessed portions 146a. Through the buckling relation, the heat dissipating member 140 is fixed between the support arms 125 of the handle 120, thereby completing the process of assembling the heat dissipating member 140 to the handle 120.

In view of the above, in the electronic module provided by the embodiment of the present invention, the heat dissipating member is disposed on the handle, so that when the electronic device is assembled on the supporting frame, and the handle is closed relative to the supporting frame to fix the electronic device, the heat dissipating member leans against the electronic device, to dissipate the heat from the electronic device. Therefore, the heat dissipating member is disposed through a simple mechanism by using the existing structures of the supporting frame and the handle, and apparatuses applying this electronic module all achieve better heat dissipation efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic module, comprising:
   a supporting frame;
   a handle, assembled to the supporting frame and being open or closed relative to the supporting frame, wherein the handle has a holding portion and a pivoting portion opposite to each other, the handle is U-shaped and has two opposite ends respectively pivoted to the supporting frame to form the pivoting portion, the handle also has a pair of support arms and a pair of buckling protrusions, the pair of the support arms are connected between the pivoting portion and the holding portion, and the pair of the buckling protrusions are located on the pair of the support arms respectively;
   an electronic device, detachably assembled on the supporting frame; and
   a heat dissipating member, detachably assembled to the handle and moving relative to the supporting frame with the handle, wherein when the handle is closed relative to the supporting frame, the electronic device is fixed on the supporting frame by the handle, and the heat dissipating member leans against the electronic device; and when the handle is opened relative to the supporting frame, the heat dissipating, member is far away from the electronic device, the heat dissipating member is connected between the pair of the support arms, and the heat dissipating member comprises:
   a base;
   multiple fins, standing on the base; and
   a pair of clamping members, disposed at two opposite sides of the base, wherein the fins are located between the pair of the clamping members, the pair of the clamping members are respectively clamped on the pair of the support arms, each clamping member has a buckling recessed portion, and the pair of the buckling protrusions are respectively buckled to the corresponding pair of the bucking recessed portions, so that the heat dissipating member is fixed between the pair of the support arms of the handle.

2. The electronic module according to claim 1, wherein the pivoting portion is pivoted to the supporting frame, the heat dissipating member is located between the holding portion and the pivoting portion, and the heat dissipating member rotates relative to the supporting frame with the handle about the pivoting portion.

3. The electronic module according to claim 1, wherein when the handle is closed relative to the supporting frame, portion of the holding portion overlaps the periphery of the electronic device.

4. The electronic module according to claim 1, wherein each support arm has a side edge, and the pair of the clamping members respectively clamp the pair of the side edges and slide along the pair of the side edges from the pivoting portion towards the holding portion, so that the pair of the buckling protrusions are respectively buckled to the corresponding pair of the buckling recessed portions.

5. The electronic module according to claim 4, wherein each clamping member comprises:
   an elastic member, disposed on the base and located at one side of the fins; and
   a plate, disposed above the elastic member, being parallel with the base and spaced from the elastic member by a distance.

6. The electronic module according to claim 5, wherein the distance is smaller than the thickness of the side edge, so that the side edge is clamped between the elastic member and the plate.

7. The electronic module according to claim 5, wherein the plate and a fin adjacent to the elastic member are integrally formed.

* * * * *